(12) United States Patent
Bai et al.

(10) Patent No.: US 8,624,581 B2
(45) Date of Patent: Jan. 7, 2014

(54) INPUT POWER MEASURING DEVICE

(75) Inventors: Yun Bai, Shenzhen (CN); Fu-Sen Yang, Shenzhen (CN); Song-Lin Tong, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 435 days.

(21) Appl. No.: 13/165,864

(22) Filed: Jun. 22, 2011

(65) Prior Publication Data

US 2012/0299582 A1 Nov. 29, 2012

(30) Foreign Application Priority Data

May 24, 2011 (CN) .......................... 2011 1 0134958

(51) Int. Cl.
*G01R 19/00* (2006.01)

(52) U.S. Cl.
USPC ...... 324/123 R; 324/73.1; 710/301; 714/805; 365/63

(58) Field of Classification Search
USPC ................. 324/762.01–762.1, 754.01–754.3, 324/755.01–755.1, 73.1, 123 R; 257/48; 438/14–18; 365/63; 710/301; 714/805
See application file for complete search history.

(56) References Cited

U.S. PATENT DOCUMENTS

| 6,467,053 B1 * | 10/2002 | Connolly et al. ............... 714/39 |
| 2008/0256281 A1 * | 10/2008 | Fahr et al. ..................... 710/305 |
| 2010/0231209 A1 * | 9/2010 | Ahmed et al. ................ 324/239 |

* cited by examiner

*Primary Examiner* — Arleen M Vazquez
*Assistant Examiner* — Son Le
(74) *Attorney, Agent, or Firm* — Altis Law Group, Inc.

(57) ABSTRACT

An input power measuring device includes a board with an edge connector, a first dual inline memory modules (DIMM) socket, a resistor, a differential amplifier circuit, a voltage dividing circuit, a display screen, and a controller. When the edge connector is inserted into a second DIMM socket of a motherboard and the motherboard is powered on, the resistor samples first current, and converts the first current into a first voltage. The differential amplifier circuit amplifiers the first current to a second current. The voltage dividing circuit divides the first voltage, and outputs a second voltage. The controller converts the second current into a third current, converts the second voltage into a third voltage, and calculates a power according to the third current and the third voltage.

3 Claims, 3 Drawing Sheets

INPUT POWER MEASURING DEVICE

BACKGROUND

1. Technical Field

The present disclosure relates to an input power measuring device.

2. Description of Related Art

With the development of flash memories (e.g., NAND memories), some attempts have been made to use these flash memories as data storage devices. One form of the data storage devices using NAND flash memories is referred as solid state drives (SSDs). In order to ensure reliability of the SSDs, a measurement for the input power of the SSDs is required. However, it is difficult to measure the input power of an SSD inserted into a dual inline memory module (DIMM) socket in a motherboard. Therefore, there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings in which like references indicate similar elements, is illustrated by way of example and not by way of limitation. It should be noted that references to "an" or "one" embodiment in this disclosure are not necessarily to the same embodiment, and such references mean at least one.

Figure 1:
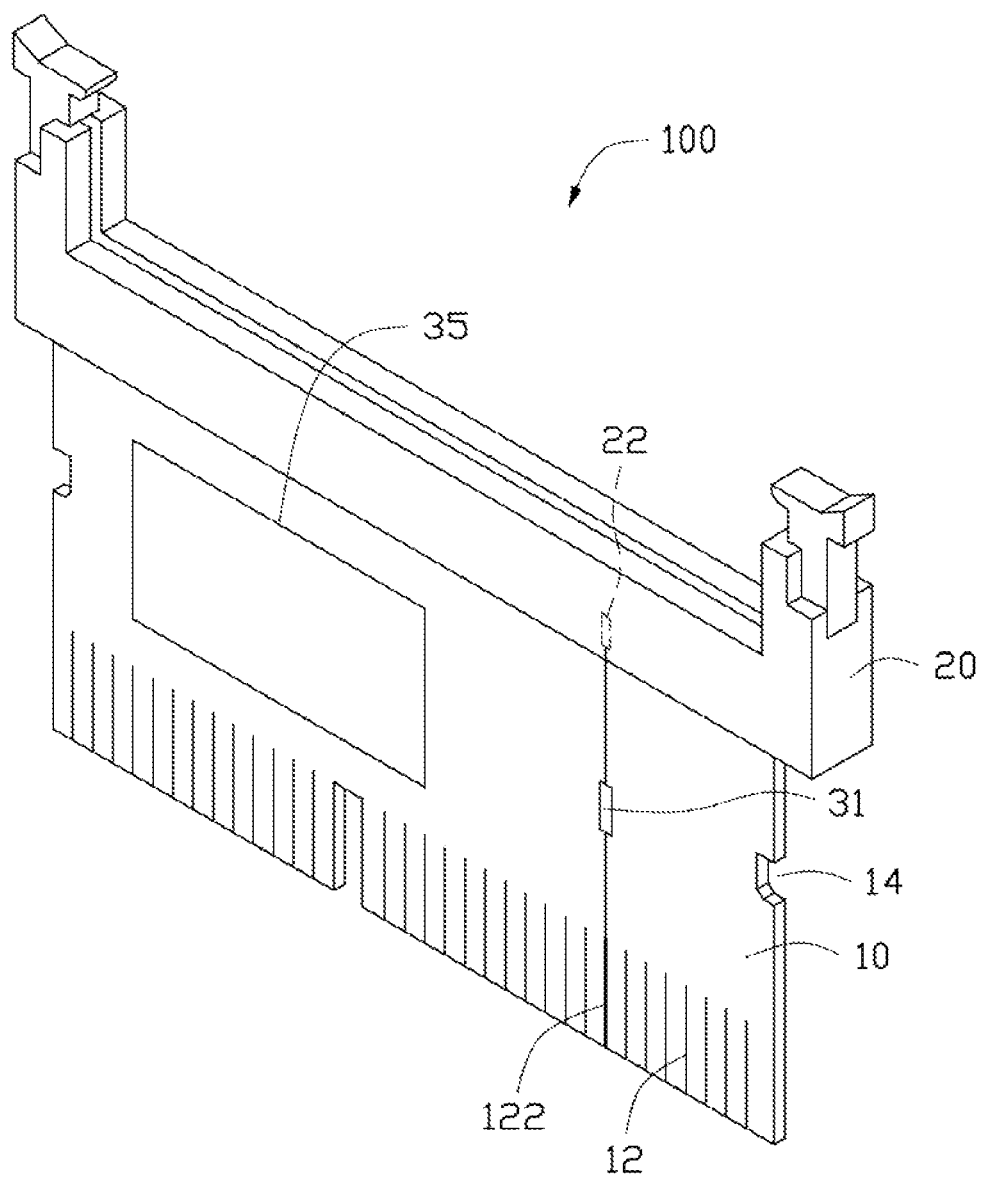
FIG. 1 is a schematic view of an embodiment of an input power measuring device, the input power measuring device includes a measuring circuit.
Figure 2:
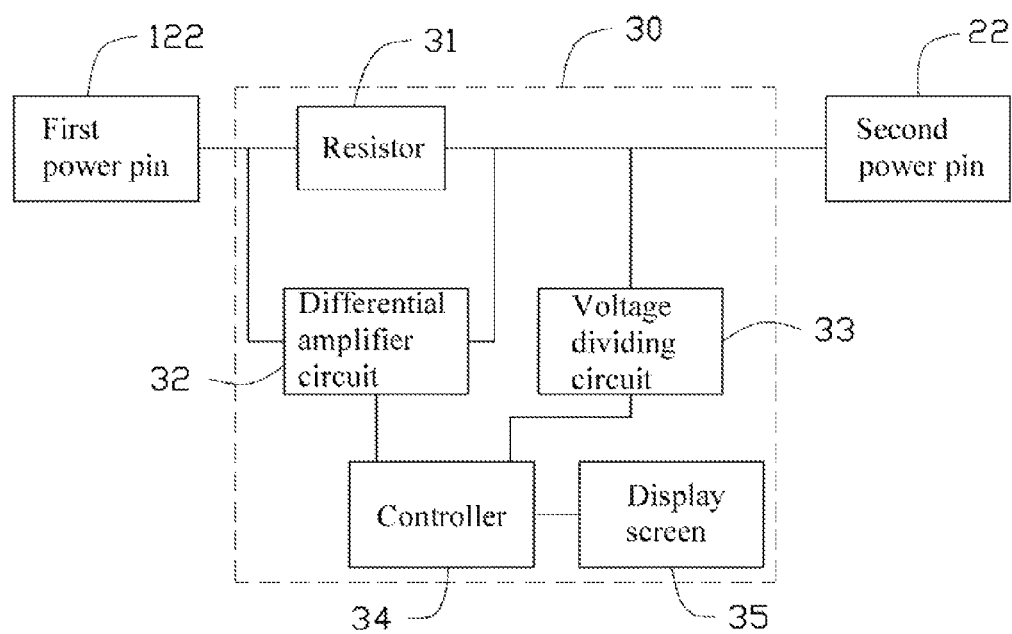
FIG. 2 is a block diagram of the measuring circuit of FIG. 1 connected between an alternating current power and a motherboard.
Figure 3:
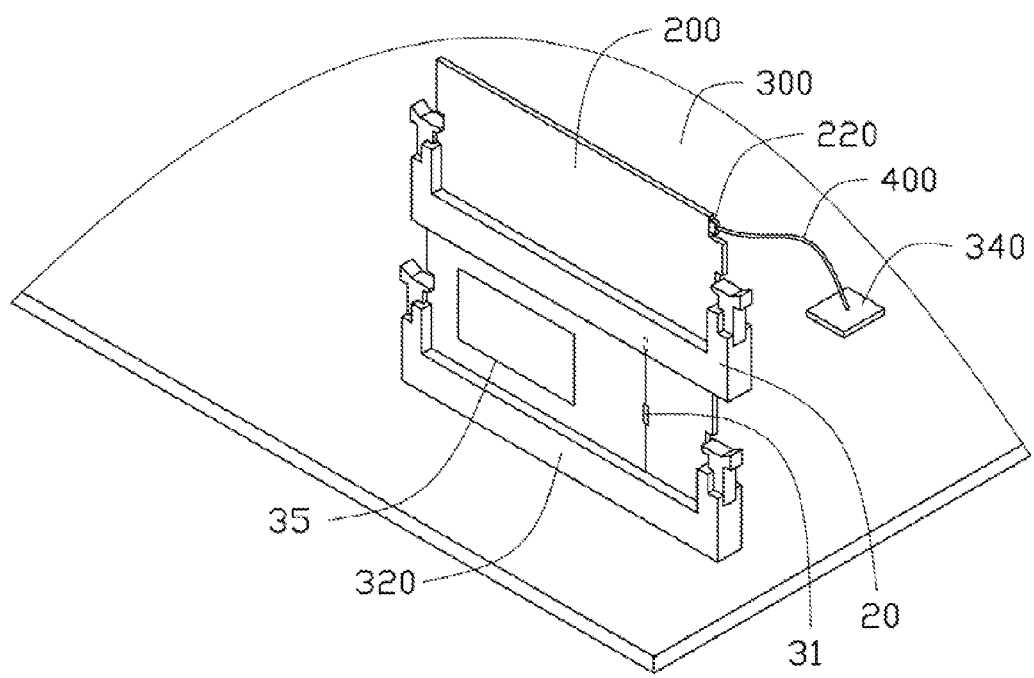
FIG. 3 is a schematic view of the input power measuring device of FIG. 1 testing an input power of a solid state drive.

Referring to the FIGS. 1-3, an embodiment of an input power measuring device 100 is used to measure an input power of a solid state drive (SSD) 200. The input power measuring device 100 includes a board 10, a dual inline memory modules (DIMM) socket 20 mounted on a top side of the board 10, and a measuring circuit 30 arranged on the board 10. Two latching slots 14 are defined in two opposite ends of the board 10. The latching slots 14 are used to engage with two latching blocks of a DIMM socket 320 mounted on a motherboard 300, thereby fixing the input power measuring device 100 to the DIMM socket 320. An edge connector 12 is formed on a bottom side of the board 10, to be inserted into the DIMM socket 320 of the motherboard 300. The DIMM socket 20 is used to engage with the SSD 200.

The measuring circuit 30 includes a resistor 31, a differential amplifier circuit 32, a voltage dividing circuit 33, a controller 34, and a display screen 35. A first terminal of the resistor 31 is connected to a first power pin 122 of the edge connector 12. A second terminal of the resistor 31 is connected to a second power pin 22 of the DIMM socket 20 and the voltage dividing circuit 33. The differential amplifier circuit 32 is connected to the resistor 31 in parallel. The controller 34 is connected to the voltage dividing circuit 33, the differential amplifier circuit 32, and the display screen 35. The display screen 35 is mounted on a surface of the board 10.

In use, the SSD 200 is inserted into the DIMM socket 20. The edge connector 12 of the input power measuring device 100 is inserted into the DIMM socket 320 of the motherboard 300. A data interface 220 of the SSD 200 is connected to a data interface 340 of the motherboard 300 through a data cable 400. When the motherboard 300 is powered on, a voltage from the motherboard 300 is supplied to the SSD 200 through the DIMM socket 320, the first power pin 122 of the edge connector 12, the resistor 31, the second power pin 22 of the DIMM socket 20. The SSD 200 communicates with the motherboard 300 through the data interfaces 220 and 340. The resistor 31 samples a first current outputted from the DIMM connector 320 of the motherboard 300, and converts the first current into a first voltage. The voltage dividing circuit 33 divides the first voltage, and outputs a second voltage to the controller 34. The differential amplifier circuit 32 amplifies the sampled first current to a second current, and output the second current to the controller 34. The controller 34 converts the second current into a third current, and converts the third current into a third voltage. The controller 34 calculates a power according to the third current and the third voltage, that is, the power is equal to a product of the third current and the third voltage. The third current is the input current of the SSD 200. The third voltage is the input voltage of the SSD 200. The power is the input power of the SSD 200. The controller 34 controls the display screen 35 to display the input current, input voltage and the input power of the SSD.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An input power measuring device to measure an input power of a solid state drive (SSD), the input power measuring device comprising:
 a board comprising an edge connector formed on a bottom side of the board;
 a first dual inline memory modules (DIMM) socket mounted on the board to engage with the SSD; and
 a measuring circuit arranged on the board, the measuring circuit comprising:
 a resistor comprising a first terminal connected to a first power pin of the edge connector and a second terminal connected to a second power pin of the first DIMM socket, wherein when the edge connector is inserted into a second DIMM socket of a motherboard and the motherboard is powered on, the first power pin of the edge connector is connected to a third power pin of the second DIMM socket to receive first current from the motherboard, the resistor samples first current from the first power pin, and converts the first current into a first voltage;
 a differential amplifier circuit connected between the first and second terminals of the resistor amplifies the first current to second current, and output the second current;

a voltage dividing circuit connected to the second terminal of the resistor divide the first voltage, and output a second voltage;

a controller connected to the voltage dividing circuit, the differential amplifier circuit, and the display screen, convert the second current into third current, convert the second voltage into a third voltage, and calculate a power according to the third current and the third voltage; and a display screen mounted on the board display the power.

2. The input power measuring device of claim 1, wherein the first DIMM socket is mounted on a top side of the board.

3. The input power measuring device of claim 2, wherein two latching slots are defined in two opposite ends of the board to engage with the second DIMM socket, thereby fixing the board in the second DIMM socket.

* * * * *